United States Patent [19]
Ohta

[11] Patent Number: 4,734,745
[45] Date of Patent: Mar. 29, 1988

[54] METHOD FOR PROJECTING AND EXPOSING A PHOTOMASK PATTERN ONTO RE-EXPOSING SUBSTRATES AND ITS APPARATUS

[75] Inventor: Kazutoshi Ohta, Yokohama, Japan
[73] Assignee: Fujitsu Limited, Kawasaki, Japan
[21] Appl. No.: 839,538
[22] Filed: Mar. 14, 1986

[30] Foreign Application Priority Data
Mar. 27, 1985 [JP] Japan ................. 60-062444

[51] Int. Cl.⁴ .................. G03B 27/52; G03B 27/70
[52] U.S. Cl. .................................. 355/45; 355/43; 355/53
[58] Field of Search ...................... 355/43, 45, 53

[56] References Cited
U.S. PATENT DOCUMENTS
4,452,526  6/1984  Johannsmeier et al. ............ 355/43
4,577,958  3/1986  Phillips ............................. 355/43
4,620,785 11/1986  Suzuki et al. .................... 355/43 X FOREIGN PATENT DOCUMENTS
0091199 10/1983  European Pat. Off. .
2843541  4/1979  Fed. Rep. of Germany .
2939204  4/1980  Fed. Rep. of Germany .
3247560  6/1983  Fed. Rep. of Germany .

OTHER PUBLICATIONS
Solid State Technology, vol. 26, No. 5, May 1983, "Application of Automatic Alignment to MOS Processing in Projection Printing", Berry et al., pp. 87–91.

Primary Examiner—Richard A. Wintercorn
Attorney, Agent, or Firm—Staas & Halsey

[57] ABSTRACT

A method and an apparatus for projecting and exposing a photomask pattern of a master mask onto a plurality of re-exposing substrates using first and second pluralities of positioning markers, marked on the master mask and a standard marker substrate, respectively, and a condensing optical system for optically aligning the mounting positions of the master mask and the re-exposing substrate and exposing the photomask pattern onto the re-exposing substrate, where the master mask and the re-exposing substrate are placed at the conjugate points of the condensing optical system. In an embodiment in which the focus length of the condensing optical system is long, the standard marker substrate is fixed in close proximity to the re-exposing substrate on the optical axis of the condensing optical system to produce a shadow image of the second positioning markers on the re-exposing substrate. In a second embodiment, in which the focus length of the condensing optical system may be long or short, the condensing optical system is separated into two condensing optical parts which are optically connected in series at a optically relaying node, and the standard marker substrate is positioned at the optically relaying node.

3 Claims, 8 Drawing Figures

METHOD FOR PROJECTING AND EXPOSING A PHOTOMASK PATTERN ONTO RE-EXPOSING SUBSTRATES AND ITS APPARATUS

BACKGROUND OF THE INVENTION

The present invention relates to a method and apparatus for projecting a photomask pattern onto and thereby exposing re-exposing substrates and/or semiconductor wafers, and, more particularly, to a method and apparatus for transcribing a standard photomask pattern of a master mask onto a plurality of re-exposing substrates, wherein the re-exposing substrates are used as work masks for patterning semiconductor devices, such as semiconductor chips, or onto a semiconductor wafer used for producing semiconductor devices.

There are three basic classifications of such methods for projecting a photomask pattern of a master mask onto, and thereby exposing, a re-exposing substrate: a contact method performed by directly attaching the re-exposing substrate to the master mask, a proximity method performed by bringing the re-exposing substrate proximately close to the master mask, and a projection method performed by projecting the image of the photomask pattern of a master mask onto a re-exposing substrate using an exposing optical system. The contact method and the proximity method have the merit that each method can be simply performed; that is, the contact method can be performed by simply directly contacting the re-exposing substrate with the master mask, and the proximity method can be performed by simply setting the re-exposing substrate in very close proximity to the master mask. However, these methods have the demerits, respectively, that a standard photomask pattern provided on the surface of the master mask is easily damaged, because the re-exposing substrate directly contacts or may readily contact the standard photomask pattern during the projecting and/or exposing process. Accordingly, recently, the projection method has become popular because the method can be performed without any contact between the surface of the re-exposing substrate and the master mask. By applying the projection method to the patterning process for the work mask production, the working life of the master mask can be increased and the production cost of the work mask can be reduced.

However, the projection method presents the problem that the accuracy of transcribing the photomask pattern onto the re-exposing substrate decreases. During projecting of the photomask pattern for exposing a plurality of the re-exposing substrates in the production of the work masks, it cannot be avoided that phenomena such as heat expansion, heat contraction, and mechanical vibration occur in the mask aligner. When these phenomena occur in the master mask, the re-exposing substrate, and/or the projecting optical system, the transcribing accuracy decreases, so that the photomask pattern transcribed on each work mask cannot be used because the photomask pattern is distorted.

Since the re-exposing substrates, after development, become the work masks and each work mask is applied to the production of semiconductor devices such as semiconductor chips, the quality of the photomask pattern, called the work photomask pattern, of each work mask greatly affects the cost of the semiconductor chips. For example, if the work photomask pattern has a defect and is applied to the production of the semiconductor chips without noticing the defect, the resulting semiconductor chip products are failures. Therefore, each work photomask pattern must be individually inspected even though the inspection takes a lot of time. Accordingly, it has been desired to shorten the time for the inspection, in other words, it has been desired to improve the prior art projecting and exposing method and apparatus so that the inspection can be easily made during the projecting and exposing process.

Figure 1:
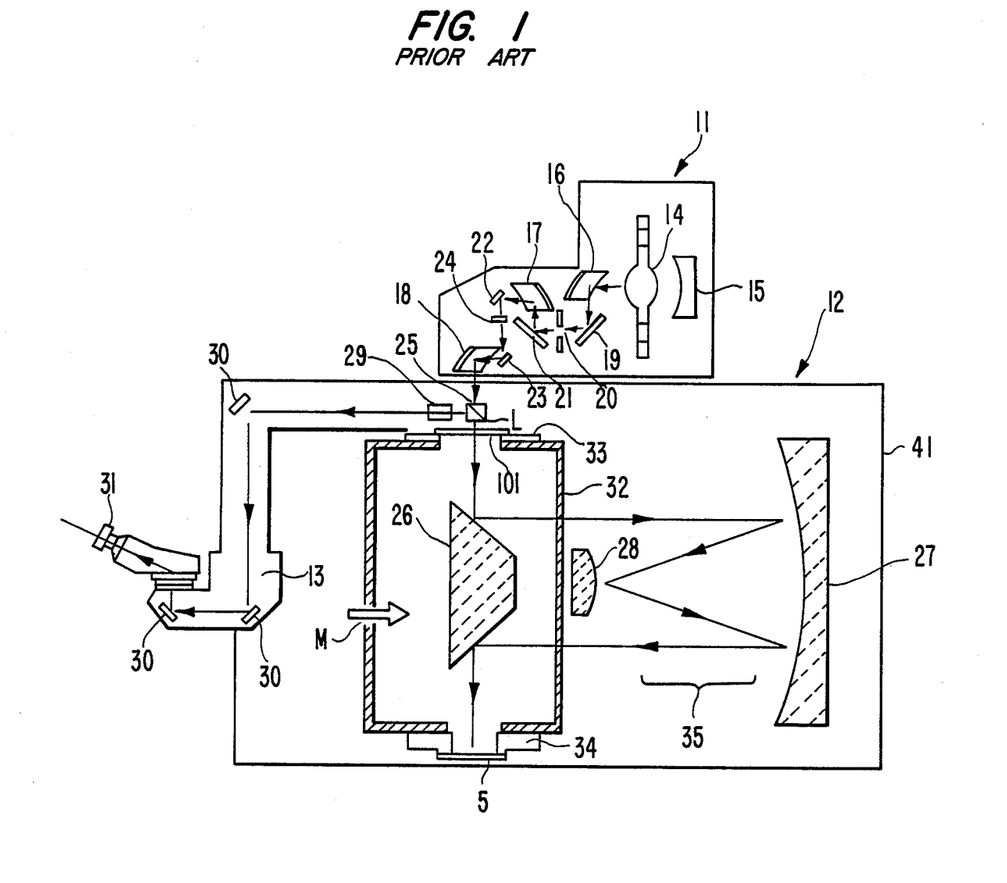
FIG. 1 is a schematic, sectional view of a projecting and exposing apparatus of the prior art.

FIG. 1 is a schematic, cross-sectional view of a projecting and exposing apparatus of the prior art. The apparatus is made by Canon Corporation and named as "Mirror Projection Mask Aligner MPA 500 FA or 600 FA" which will be abbreviated as "mask aligner" hereinafter.

As shown in FIG. 1, the mask aligner comprises a light source unit 11 and a projecting optical unit 12 in which a carriage 32 is installed. The light source unit 11 is tightly mounted on a frame 41 of the projecting optical unit 12, and a carriage 32 is placed inside of the frame 41 so as to be movable relative to frame 41 in a direction M.

In light source unit 11, the light emitted from a light source 14, which is a xenon-mercury (Xe-Hg) lamp, is gathered by spherical mirrors 15 and 16 and reflected by a cold mirror 19, which ejects heat radiation emitted from light source 14, and passes through a slit 20 having the shape of a slender circular arc. The light which has passed through slit 20 is reflected by aluminum plane mirrors 21, 22 and 23 and spherical mirrors 17 and 18, and is led to projecting optical unit 12 after passing through a filtering shutter 24. The light which has arrived at the projecting optical unit 12 passes through a half mirror 25 and forms a light beam L having a cut shape, similar to the shape of slit 20, and which produces an image of slit 20 at the beam entrance of carriage 32. At the beam entrance of carriage 32, there is a mask holder 33 on which a master mask 101 is mounted. The light beam L which has passed through a standard photomask pattern of the master mask 101 is nearly perpendicularly reflected by one face of a trapezoidal reflector 26, condensed by a condensing mirror system 35 comprising a concave mirror 27 and a convex mirror 28, again reflected by the other face of trapezoidal reflector 26, and produces an image of the standard photomask pattern at the beam exit of carriage 32. At the beam exit of carriage 32, there is a mounting base 34 on which a re-exposing substrate 5 is mounted, onto which the image of the standard photomask pattern is projected. In other words, the mounted positions of master mask 101 and re-exposing substrate 5 are conjugate positions of the condensing mirror system 35.

The condensing mirror system 35 and trapezoidal reflector 26 are fixed to frame 41, which means that light beam L constantly passes along a fixed path, defined by the optical axis of the condensing mirror system 35, in frame 41, whereas carriage 32 is installed in frame 41 through an air bearing so that carriage 32 can move in direction M carrying master mask 101 and re-exposing substrate 5, the air bearing not being shown in FIG. 1.

Therefore, when the slender circular arc spotlight image of slit 20 is formed on the surface of master mask 101 and runs across the surface of master mask 101 perpendicularly to direction M, the carriage 32 is moved by an amount equal to the width scanned by the slender circular arc spotlight over the surface of master mask 101. Accordingly, by the movement of carriage 32 in direction M, the image of the standard photomask pattern of master mask 101 can be projected onto and thereby expose the re-exposing substrate 5.

The projecting and exposing process is generally performed by two steps using the mask aligner: an alignment step and an exposing step. In the alignment step, the mounted positions of master mask 101 and re-exposing substrate 5 are aligned so that the mounted positions coincide with the conjugate points of the condensing mirror system 35, and the surfaces of master mask 101 and re-exposing substrate 5 are positioned perpendicular to light beam L and the optical axis of the condensing mirror system 35, respectively. In the exposing step, the standard photomask pattern of master mask 101 is projected onto and thereby exposes the re-exposing substrate 5. In the production of the work masks, the alignment step is usually performed only once, and after the alignment step, the exposing step is performed on the rest of the re-exposing substrates, one by one, for saving production time.

The alignment step is carried out by: (1) previously providing a plurality of first positioning markers, marked on the surface of master mask 101 around the standard photomask pattern; (2) mounting master mask 101 on mask holder 33; (3) newly preparing a standard marker substrate on which a plurality of second positioning markers are provided in the same arrangement and pitch as the arrangement and pitch of the first positioning markers; (4) initially mounting the standard marker substrate, which is not shown in FIG. 1, on mounting base 34; (5) observing the marker images of the first and the second positioning markers using an alignment scope 31 shown in FIG. 1, where the image of the first positioning markers is obtained by light reflected from the first positioning markers and passed through a half mirror 25, a field lens 29, and reflectors 30a and 30b, and the marker image of the second positioning markers is obtained by light reflected from the second positioning markers and passed through trapezoidal reflector 26, convex mirror 28, concave mirror 27, half mirror 25, field lens 29, and reflectors 30a and 30b, and where the first and the second positioning markers are provided so that the respective marker images can be observed, superimposed on each other, by alignment scope 31; (6) detecting the deviation appearing between the first and the second marker images, paying attention also to whether there is improper orthongonality and runout, i.e., the above-noted optical distortions resulting from thermal expansion and contraction of parts, occurring between the marker images; and (7) aligning the position of carriage 32 by adjusting an air bearing controller, which is not shown in FIG. 1, until the deviation is minimized, as determined by observation through the alignment scope 31.

After the alignment step, the exposing step is carried out by: (1) removing the standard marker substrate from mounting base 34; (2) mounting re-exposing substrate 5 on mounting base 34; (3) exposing the standard photomask pattern of master mask 101 onto the re-exposing substrate 5; and (4) repeating the above steps (2) and (3) for the rest of the re-exposing substrates until all of the re-exposing substrates are exposed.

However, even though the alignment step is correctly carried out, there is still a problem in the exposing step; that is, there is a possibility of the deviation which appears between the marker images increasing, because undesirable mechanical vibration and temperature change may occur in the mask aligner during the exposing step, which requires a lot of time for exposing the photomask patterns onto a plurality of the re-exposing substrates. If the alignment step were carried out for each successive re-exposing substrate, the above problem could be avoided; specifically, and by analogy to the alignment step involving items (1) through (7), after the step (8) of developing the re-exposing substrate, the further step (9) of confirming whether the alignment had been correctly performed or not could be achieved by inspecting the deviation which appears between the first and the second marker images which are printed on the work mask by the development. Realistically, this is impossible to do because this occupies the mask aligner for too much time. However, if the work masks were applied to the production of the semiconductor devices without any inspection, the yield rate of the production of the semiconductor devices would be decreased. Therefore, usually, the work photomask patterns of the work masks are individually inspected, for example by a pattern comparing inspecting method, before applying the work mask to the production of the semiconductor devices.

As mentioned above, in the prior art, there is the problem that the transcribing accuracy cannot be kept high in the production of the work masks without individually inspecting the work photomask patterns of the work masks, and the latter requires a lot of time and this is undesirable.

SUMMARY OF THE INVENTION

An object of the present invention is to increase the accuracy of transcribing photomask patterns from a master mask to work masks, when a plurality of the work masks are required to be produced.

Another object of the present invention is to decrease the time required for inspecting the photomask patterns projected onto the re-exposing substrates, by maintaining high accuracy of the photomask patterns projected on the re-exposing substrates while the photomask pattern is individually and sequentially exposed onto a plurality of re-exposing substrates.

Still another object of the present invention is to decrease the production cost of the work masks.

When the focal length of the condensing mirror system of the projecting optical unit of the mask aligner is long, the above objects can be achieved by positioning the standard marker substrate in the path of the light beam L and in close proximity to the re-exposing substrate mounted on the carriage.

In either the case that the focal length of the condensing mirror system of the projecting optical unit is short or the case that the focal length is long, the above objects can be achieved by positioning the standard marker substrate at an optically relaying node of two condensing optical systems, that is, the above objects can be achieved by providing a second condensing optical system, in addition to the usual, or first, projecting optical unit of the mask aligner, and mounting the re-exposing substrate at a position corresponding to the image plane of the second condensing optical system, the second condensing optical system being fixed to the carriage and having a common optical axis with the usual, or first, condensing mirror system.

DESCRIPTION OF THE PREFERRED EMBODIMENTS

Figure 2:
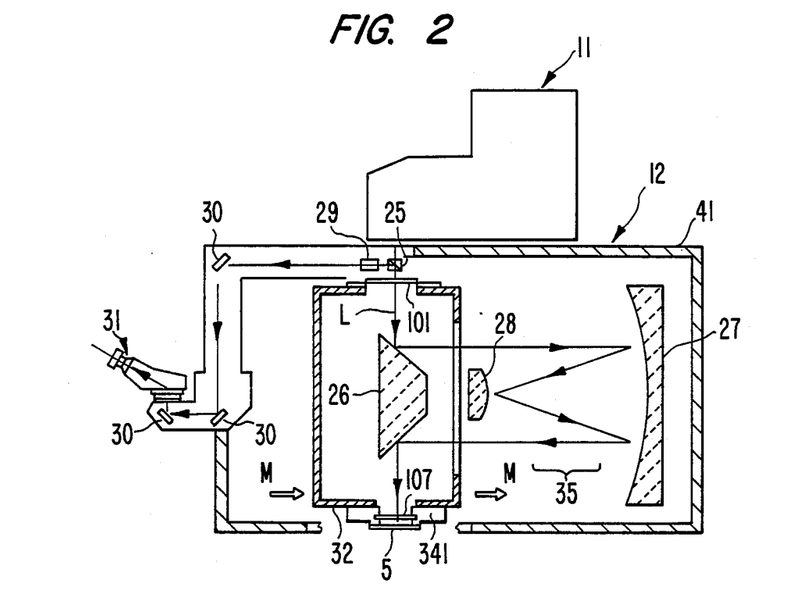
FIG. 2 is a schematic, sectional view of a mask aligner in accordance with a first embodiment of the present invention.

FIG. 2 is a schematic, cross-sectional view of a first mask aligner embodiment of the present invention wherein the focal length of the condensing mirror system used in the projecting optical unit of the mask aligner is long. In FIG. 2, the elements or parts having the same reference numerals or symbols as in FIG. 1 have the same functions as in FIG. 1. In FIG. 2, reference numeral 341 is a mounting base on which re-exposing substrate 5 is mounted. A standard marker substrate 107, having second positioning markers, is positioned at a fixed point of carriage 32, the fixed point being located in the path of light beam L in close proximity to the mounted re-exposing substrate 5. The light beam L which has passed through a master mask 101 arrives at re-exposing substrate 5 through the trapezoidal mirror 26 and the condensing mirror system 35 comprising concave mirror 27 and convex mirror 28. Accordingly, the images of the standard photomask pattern and the first positioning markers, which are marked around the standard photomask patterns, of master mask 101 are projected onto re-exposing substrate 5 by condensing mirror system 35; at the same time, light beam L, which has passed through standard marker substrate 107, projects a shadow image of the second positioning markers of the standard marker substrate 107 onto the re-exposing substrate 5, so that the images of the first and the second positioning markers are superimposed on each other on the surface of re-exposing substrate 5.

Figure 3:
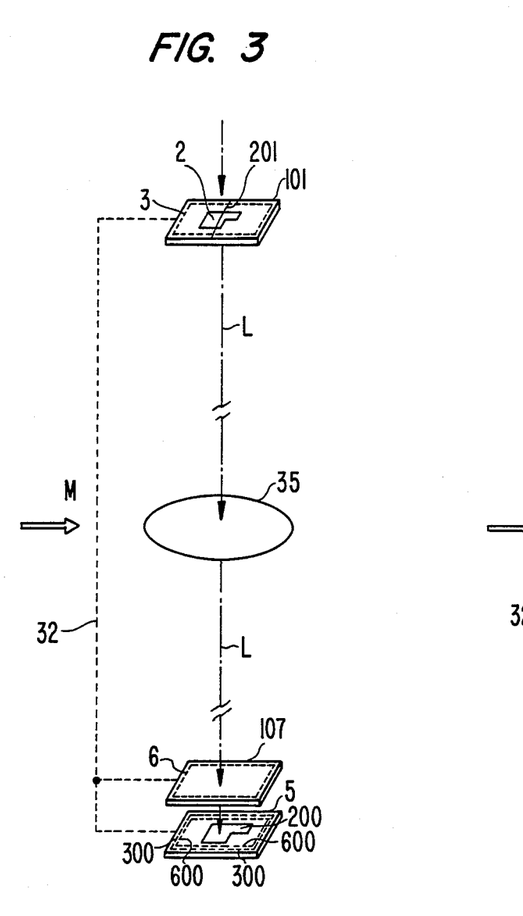
FIG. 3 is a schematic diagram illustrating the optical system of the mask aligner of FIG. 2.

FIG. 3 illustrates how the image of the standard photomask pattern 2 is projected optically onto the re-exposing substrate 5 and how the images of the first positioning markers 3 and the second positioning markers 6 are projected onto the re-exposing substrate 5, superimposed on each other. In FIG. 3, the same reference numerals as in FIG. 2 designate the same elements as in FIG. 2. The standard photomask pattern 2 is positioned at the center of master mask 101, and a plurality of the first positioning markers 3 are arranged around standard photomask pattern 2. The light beam L and condensing mirror system 35 are fixed in position, as shown in FIG. 2, to the frame 41 of an projecting optical unit 12. Similarly, the master mask 101, standard marker substrate 107, and re-exposing substrate 5 are fixed to carriage 32 and carriage 32 is movable relatively to frame 41 in direction M. The light beam L forms a spotlight 201, having the shape of a slender circular arc, on the surface of master mask 101 and arrives at re-exposing substrate 5 after passing through the condensing mirror system 35 and the standard marker substrate 107, the latter having the second positioning markers 6 thereon with the same arrangement and pitch as the first positioning markers 3. Since master mask 101 and re-exposing substrate 5 are placed at the conjugate planes of the condensing mirror system 35, the image 200 of the standard photomask pattern 2 and the image 300 of the first positioning markers 3 are projected onto re-exposing substrate 5 when carriage 32 scans in direction M. Moreover, since standard marker substrate 107 is placed close to the re-exposing substrate 5 and in the path of light beam L, the shadow image 600 of the second positioning markers 6 is also projected onto re-exposing substrate 5, for superimposing the images 300 and 600. Generally, a shadow image cannot be obtained which is as sharp as a focused image; however, when the focal length of the condensing mirror system 35 is long and the distance between re-exposing substrate 5 and standard marker substrate 107 is short, the blur of the shadow image 600 can be neglected. The light beam reflected from the first positioning markers 3 and the light beam reflected from the second positioning markers 6 then arrive at the alignment scope 31; (in FIG. 2). The alignment and the inspection with respect to the mounted positions of master mask 101 and re-exposing substrate 5 can be performed by observing same through the alignment scope 31, as explained before in relation to FIG.

However, by contrast to the prior art system of FIG. 1 and in accordance with in the first embodiment of the invention shown in FIGS. 2 and 3, since the standard marker substrate 107 is always fixed to carriage 32, the inspection of the correct alignment can be performed at any time, including during the exposing step, by observing same through the alignment scope 31, therefore, the production of the work masks can be performed in a short time, while keeping the transcribing accuracy high. The marker images in alignment scope 31 also can be re-inspected if it is necessary, for confirming that the marker images are still correctly related, by inspecting the marker images developed on the work mask as done in the alignment step.

Figure 4:
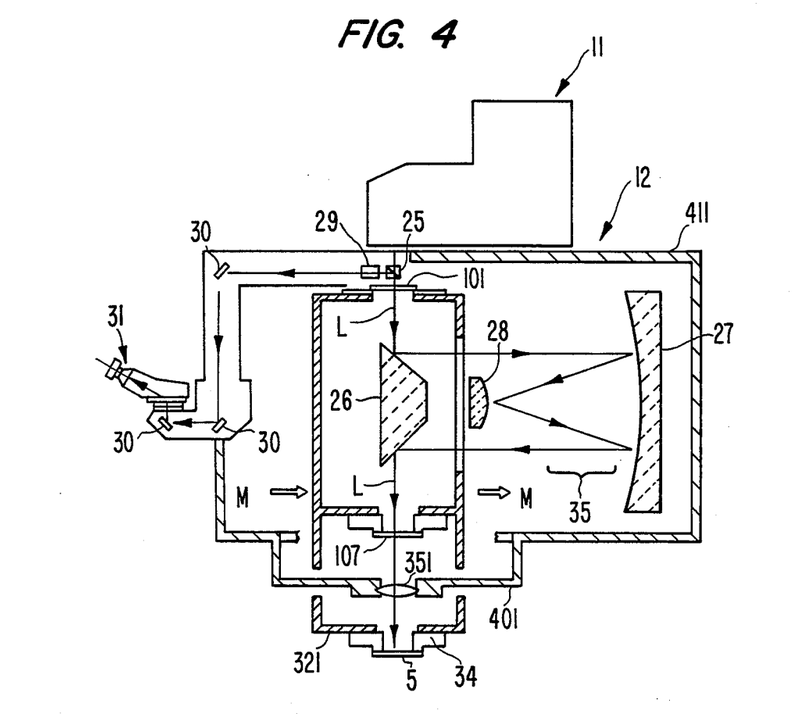
FIG. 4 is a schematic, cross-sectional view of a mask aligner in accordance with a second embodiment of the present invention.

FIG. 4 is a schematic, cross-sectional view of a second mask aligner embodiment of the present invention. In FIG. 4, the elements or parts having the same reference numerals or symbols as in FIGS. 1 and 2 have the same functions as in FIGS. 1 and 2; however, in this embodiment, the focal length of the condensing mirror system 35 is free from consideration. The second embodiment comprises both a first condensing optical system comprising the condensing mirror system 35 and a second condensing optical system comprising the condensing lens system 351. The second condensing optical system 351 is provided in the path of light beam L of the condensing mirror system 35, and extends that path beyond the image plane on which re-exposing substrate 5 was mounted in the first embodiment, so that the first condensing mirror system 35 and the second optical system 351 have a common optical axis and optically coincide at that image plane. That image plane will be called an optically relaying node hereinafter, and defines the position at which standard marker substrate 107 is fixed. In this second embodiment, the re-exposing substrate 5 is mounted at the image plane of the condensing optical system 351; therefore, it can be said that the mounted positions of the master mask 101 and the re-exposing substrate 5 correspond to the conjugate points of the total, or combined, condensing optical system comprising the condensing mirror system 35 and the condensing optical system 351, and which are optically connected, or coincide, at the optically relaying node. The condensing optical system 351 is fixed to frame 411 of the mask aligner of the second embodiment by a support arm 401 which projects integrally from frame 411.

Figure 5:
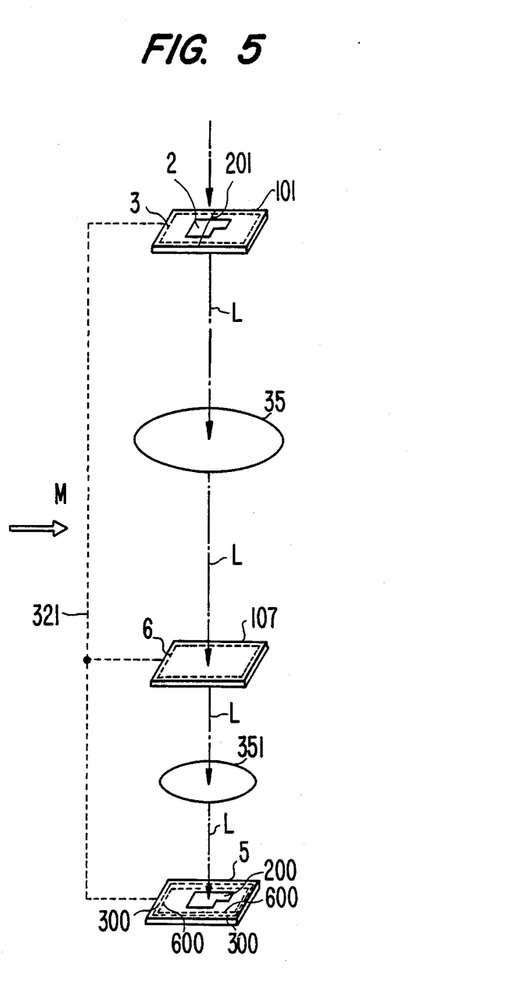
FIG. 5 is a schematic diagram for illustrating the optical system of the mask aligner of FIG. 4.

FIG. 5 illustrates how the image of standard photomask pattern 2 of master mask 101 is projected onto re-exposing substrate 5 and how the images of the first positioning markers 3 of master mask 101 and the second positioning markers 6 of standard marker substrate 107 are projected onto re-exposing substrate 5, in superimposed relationship. In FIG. 5, the same reference numerals as in FIGS. 3 and 4 designate the same elements as in FIGS. 3 and 4. Similarly to what has been discussed in FIG. 3, when carriage 321, carrying master mask 101, standard marker substrate 107 and re-exposing substrate 5, moves in direction M, the images of the standard photomask pattern 2 and the first positioning markers 3 are projected onto the surface of the standard marker substrate 107 by the condensing mirror system 35 and further are projected by the condensing optical system 351 onto the surface of re-exposing substrate 5, producing the projected images 200 and 300, respectively. At the same time, in the above scanning, the image of the second positioning markers 6 is projected by the condensing optical system 351 onto the surface of the re-exposing substrate 5, producing the projected image 600 which is superimposed on the projected image 300.

In use of the system of FIGS. 4 and 5, the alignment step and the projecting step are carried out similarly to the steps discussed in relation to FIGS. 2 and 3, in relation to observing the images of the first positioning markers 3 and the second positioning markers 6. In the mask aligner of this second embodiment, the standard marker substrate 107 is placed at the image plane of the condensing mirror system 35 which, as noted, is an optical relaying mode relatively to both systems 35 and 351, so that image 600 is not blurred (as in the first embodiment). In the second embodiment, there are the same merits as in the first embodiment, in that the alignment inspection can be performed by observing the images 300 and 600 of the positioning markers 3 and 6, respectively, through the alignment scope 31 during the exposing step, the exposure can be made in a short time while keeping the transcribing accuracy high, and the re-confirmation of the proper alignment of the marker images 300 and 600 can be made by inspecting the images of the positioning markers, as developed on the work mask, if it is necessary.

As discussed above, when the first and the second embodiments are applied to the production of work masks, the inspection as to the transcribing accuracy of a photomask pattern can be made easily by observations using the alignment scope 31 in the projecting step, and the labor of mounting and demounting a standard marker substrate 107 are no longer necessary. Since the inspection can be performed individually for each successive re-exposing substrate, the problem of irregular exposure, which happens due to the mechanical vibration or the temperature change of the mask aligner during the exposing step, can be avoided.

Figure 6:
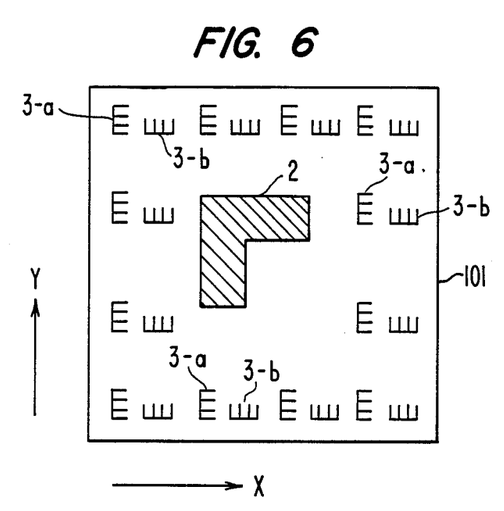
FIG. 6 is a schematic, plan view of first positioning markers and a standard photomask pattern of a master mask used in each of the first and the second mask aligner embodiments.
Figure 7:
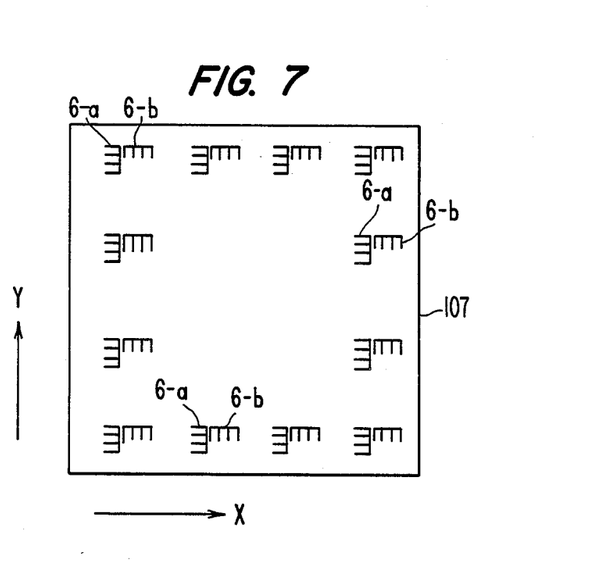
FIG. 7 is a schematic, plan view of second positioning markers of a standard marker substrate used in each of the first and the second mask aligner embodiments.

The first positioning markers 3 of master mask 101 are provided as shown in FIG. 6, and the second positioning markers 6 of standard marker substrate 107 are provided as shown in FIG. 7. In FIG. 6, the first positioning markers 3 are arranged around a standard photomask pattern 2 which is placed at the center portion of a master mask 101, and the first positioning markers 3 are classified into two groups: group 3-*a* and group 3-*b*. Each marker in each group has a scale; each marker of group 3-*a* has a scale arranged in the Y direction and each marker of group 3-*b* has a scale arranged in the X direction, as shown in FIG. 6.

The second positioning markers 6 are of the same number as the first positioning markers 3. The second positioning markers 6 are also classified into two groups: group 6-*a* and group 6-*b*. The markers of groups 6-*a* and 6-*b* are arranged to correspond to the markers of groups 3-*a* and 3-*b*, respectively, as shown in FIG. 7, and each marker in each group 6*a* and 6*b* has a scale which functions as a Vernier scale with respect to the scale of the respectively corresponding first positioning markers of groups 3*a* and 3*b*.

Figure 8:
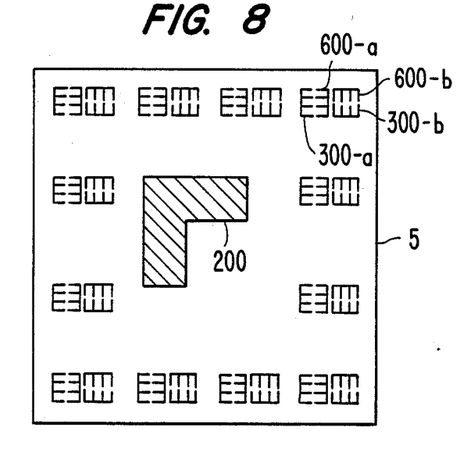
FIG. 8 is a schematic, plan view of the images of positioning markers and a photomask pattern projected onto a re-exposing substrate.

FIG. 8 shows the images projected onto re-exposing substrate 5. The image 200 is the projected image of standard photomask pattern 2 of master mask 101, images 300-*a* and 300-*b* are the projected images of first positioning markers 3-*a* and 3-*b* of master mask 101, respectively, and images 600-*a* and 600-*b* are the projected images of second positioning markers 6-*a* and 6-*b* of standard marker substrate 107, respectively. The groups of marker images 300-*a*, 300-*b* 600-*a*, and 600-*b* can be observed by alignment scope 31. The alignment and the inspection can be made by checking the extent of the observed deviation, counted from the respective Vernier scales.

In the above discussion, the re-exposing substrate is what becomes the work mask; however, the present invention can be applied as well to a re-exposing substrate which is to become the resultant semiconductor wafer.

I claim:

1. An apparatus for projecting an optical image of a photomask pattern of a master mask onto and thereby exposing a re-exposing substrate and using, for alignment purposes, first positioning markers marked on said master mask and second positioning markers marked on said master mask and second positioning markers marked on a standard marker substrate, said first positioning markers being arranged with a predetermined pitch on said master mask in association with said photomask pattern and said second positioning markers being arranged with the same predetermined pitch, said apparatus comprising:

a frame;

light beam emitting means secured to said frame and emitting a light beam along a predetermined direction;

optical condensing mean having an optical axis and secured to said frame with the optical axis in alignment with the predetermined direction of, and to receive, the light beam;

a carriage;

means for mounting said carriage for movement relatively to said frame and for mounting to said carriage, for common movement therewith, said master mask, said re-exposing substrate, and said standard marker substrate, said master mask and said standard marker substrate being positioned at the conjugate planes of the optical condensing means and said standard marker substrate being positioned in close proximity to said re-exposing substrate and intermediate said optical condensing means and said re-exposing substrate;

said mounting means further comprising means for aligning said carriage for movement in a direction perpendicular to the predetermined direction of the light beam and of the corresponding optical axis of said optical condensing means and for aligning said master mask and said re-exposing substrate to be perpendicular to the light beam and the corresponding optical axis of the optical condensing means during movement of said carriage and of said master mask and said re-exposing substrate therewith and for aligning said standard marker substrate with said re-exposing substrate;

means for moving said carriage to cause scanning of said master mask and of said standard marker substrate for projecting an optical image of the photomask pattern of said master mask onto said re-exposing substrate, for exposing same, and for projecting an optical image of the first positioning markers of said master mask and a shadow image of said second positioning markers of said standard marker substrate on said re-exposing substrate; and alignment scope means secured to said frame for observing, by reflected light, the images of the first and second positioning markers projected on said re-exposing substrate, during the aforesaid optical scanning, for inspecting the alignment and for monitoring the minimization of deviation between the first and second positioning markers during adjustment of the alignment by said means for aligning.

2. An apparatus for projecting an optical image of a photomask pattern of a master mask onto and thereby exposing a re-exposing substrate and using, for alignment purposes, first positioning markers marked on said master mask and second positioning markers marked on said master mask and second positioning markers marked on a standard marker substrate, said first positioning markers being arranged with a predetermined pitch on said master mask in association with said photomask pattern and said second positioning markers being arranged with the same predetermined pitch, said apparatus comprising:

a frame;

light beam emitting means secured to said frame and emitting a light beam along a predetermined direction;

optical condensing means having an optical axis and secured to said frame with the optical axis in alignment with the predetermined direction of, and to receive, the light beam, said optical condensing means comprising first and second optical condensing means having a common optical axis and coupled together at an optical relaying node of the common axis;

a carriage;

means for mounting said carriage for movement relatively to said frame and for mounting to said carriage, for common movement therewith, said master mask, said re-exposing substrate, and said standard marker substrate, said master mask and said standard marker substrate being positioned at the conjugate planes of the optical condensing means comprising said first and second optical condensing means, and said standard marker substrate being positioned at the optical relaying node of said optical condensing means, intermediate said first optical condensing means and said second optical condensing means, and said second optical condensing means being located along the optical axis intermediate said standard marker substrate and said re-exposing substrate;

said mounting means further comprising means for aligning said carriage for movement in a direction perpendicular to the predetermined direction of the light beam and of the corresponding optical axis of the optical condensing means and for aligning said master mask and said re-exposing substrate to be perpendicular to the light beam and the corresponding optical axis of optical condensing means during movement of said carriage and of said master mask and said re-exposing substrate therewith and for aligning said standard marker substrate with re-exposing substrate;

means for moving said carriage to cause scanning of said master mask and of said standard marker substrate for projecting an optical image of the photomask pattern of said master mask onto said re-exposing substrate, for exposing same, and for projecting an optical image of the first positioning markers of said master mask and a shadow image of said second positioning markers of said standard marker substrate on said re-exposing substrate; and alignment scope means secured to said frame for observing, by reflected light, the images of the first and second positioning markers projected on said re-exposing substrate, during the aforesaid optical scanning, for inspecting the alignment and for monitoring the minimization of deviation between the first and second positioning markers during adjustment of the alignment by the means for aligning.

3. An apparatus as recited in claim 2 wherein:

said first optical condensing means comprises a condensing mirror system; and said second optical condensing system comprises an optical condensing lens system.

* * * * *

UNITED STATES PATENT AND TRADEMARK OFFICE
CERTIFICATE OF CORRECTION

PATENT NO. : 4,734,745
DATED : March 29, 1988
INVENTOR(S) : Kazutoshi OHTA

It is certified that error appears in the above-identified patent and that said Letters Patent is hereby corrected as shown below:

Front Page [57] ABSTRACT, line 21, change "a" to --an--.

Col. 5, line 65, change "an" to --a--.

Col. 6, line 32, after "FIG." insert --1.--.

Col. 8, line 58, change "mean" to --means--.

Col. 10, line 28, change "of optical" to --of said optical--;

line 46, change "scanning,for" to --scanning, for--.

Signed and Sealed this

Thirteenth Day of September, 1988

Attest:

DONALD J. QUIGG

*Attesting Officer*     *Commissioner of Patents and Trademarks*